(12) United States Patent
Zhu et al.

(10) Patent No.: US 11,148,935 B2
(45) Date of Patent: Oct. 19, 2021

(54) FULL SYMMETRIC MULTI-THROW SWITCH USING CONFORMAL PINCHED THROUGH VIA

(71) Applicant: Menlo Microsystems, Inc., Irvine, CA (US)

(72) Inventors: Xu Zhu, Belmont, MA (US); Darryl R. Evans, Tustin, CA (US); Christopher F. Keimel, Niskayuna, NY (US)

(73) Assignee: Menlo Microsystems, Inc., Irvine, CA (US)

( * ) Notice: Subject to any disclaimer, the term of this patent is extended or adjusted under 35 U.S.C. 154(b) by 0 days.

(21) Appl. No.: 16/283,306

(22) Filed: Feb. 22, 2019

(65) Prior Publication Data
US 2020/0270120 A1  Aug. 27, 2020

(51) Int. Cl.
| | | |
|---|---|---|
| *H01L 41/113* | (2006.01) | |
| *B81B 7/00* | (2006.01) | |
| *H01H 1/00* | (2006.01) | |

(52) U.S. Cl.
CPC ......... *B81B 7/0006* (2013.01); *H01H 1/0036* (2013.01); *B81B 2201/018* (2013.01); *B81B 2207/095* (2013.01); *B81B 2207/096* (2013.01)

(58) Field of Classification Search
CPC ............ H01L 41/1134; H01L 41/1136; H01L 41/1138
See application file for complete search history.

(56) References Cited

U.S. PATENT DOCUMENTS

| | | |
|---|---|---|
| 9,082,764 B2 | 7/2015 | Chen et al. |
| 9,263,300 B2 | 2/2016 | Tsai et al. |
| 9,296,646 B2 | 3/2016 | Burket et al. |
| 9,321,680 B2 | 4/2016 | Chuang et al. |
| 9,472,479 B2 | 10/2016 | Chaparala et al. |
| 9,656,909 B2 | 5/2017 | Burket et al. |
| 9,758,876 B2 | 9/2017 | Shorey et al. |

(Continued)

OTHER PUBLICATIONS

Parmar, R. and Zhang, J., "Glass Packaging for RF MEMS" Corning Incorporated, May 2018.

(Continued)

*Primary Examiner* — Cuong Q Nguyen
(74) *Attorney, Agent, or Firm* — Hamilton, Brook, Smith & Reynolds, P.C.

(57) ABSTRACT

A hermetically sealed component may comprise a glass substrate, a device with at least one electrical port associated with the glass substrate, and a glass cap. The glass cap may have at least one side wall. The glass cap may have a shaped void extending therethrough, from top surface of the glass cap to bottom surface of glass pillar. An electrically conductive plug may be disposed within the void, the plug configured to hermetically seal the void. The electrically conductive plug may be electrically coupled to the electrical port. The glass cap may be disposed on the glass substrate, with the at least one side wall disposed therebetween, to form a cavity encompassing the device. The side wall may contact the glass substrate and the glass cap to provide a hermetic seal, such that a first environment within the cavity is isolated from a second environment external to the cavity.

19 Claims, 12 Drawing Sheets
(2 of 12 Drawing Sheet(s) Filed in Color)

(56) References Cited

U.S. PATENT DOCUMENTS

| | | | |
|---|---|---|---|
| 9,917,045 B2 | 3/2018 | Chaparala et al. | |
| 9,953,912 B2 | 4/2018 | Goers | |
| 10,077,206 B2 | 9/2018 | Castle et al. | |
| 2004/0259325 A1* | 12/2004 | Gan | H01L 25/0657 438/456 |
| 2008/0174781 A1* | 7/2008 | Berthold | G01P 1/023 356/477 |
| 2014/0184352 A1 | 7/2014 | Morihara | |
| 2014/0253260 A1 | 9/2014 | Horimoto | |
| 2015/0353348 A1 | 12/2015 | Vandemeer | |
| 2016/0035587 A1 | 2/2016 | Keech et al. | |
| 2017/0062159 A1* | 3/2017 | Zeyen | H01H 36/0013 |
| 2017/0287728 A1 | 10/2017 | Dahlberg et al. | |
| 2017/0335466 A1 | 11/2017 | Domey et al. | |
| 2017/0352553 A1 | 12/2017 | Bellman et al. | |
| 2018/0003477 A1 | 1/2018 | Goers et al. | |
| 2018/0005922 A1 | 1/2018 | Levesque, Jr. et al. | |
| 2018/0068868 A1 | 3/2018 | Jaramillo et al. | |
| 2018/0076052 A1 | 3/2018 | Jin | |
| 2018/0204792 A1 | 7/2018 | Goers | |
| 2019/0103852 A1* | 4/2019 | Gilbert | H01L 41/0477 |
| 2020/0251424 A1* | 8/2020 | Mazumder | H01L 23/562 |

OTHER PUBLICATIONS

Giovanniello, C., "High-Reliability MEMS Switching with Low-cost Glass Packaging for Sub-6GHz & mmWave Radio Architectures" IWPC 4G/5G Muli-band, Multi-mode User Equipment Workshop, Austin, TX, Oct. 18, 2018.

Keimel, C., "The material importance for reliable RF MEMS switches" The 2018 IEEE MIT-S, International Microwave Symposium, Philadelphia, PA, Jun. 10-15, 2018.

International Search Report and Written Opinion for PCT/US2019/019160 dated Nov. 4, 2019, titled "Full Symmetric Multi-Throw Switch Using Conformal Pinched Through Via".

* cited by examiner

FIG. 3C

FULL SYMMETRIC MULTI-THROW SWITCH USING CONFORMAL PINCHED THROUGH VIA

BACKGROUND

Certain devices, such as switches, may not operate reliably and consistently when exposed to uncontrolled operational environmental conditions. Moisture and contamination could cause an increase in early device failures. Accordingly, it is common practice to contain such devices within a protective package, which, at least to some extent, separates an internal device environment from an external environment. The packaging, however, may be susceptible to certain weak points. Package seams, for example, can provide an opportunity for a leak between the package interior and the external environment. Electrical connections, which electrically couple the device to components in the external environment, must pass from the external environment into the device environment and to the device. Device packages may use a "via," or multiple vias, which are shaped voids in the package walls, to convey a conductor through the package from the external environment to the device environment. Such vias generally provide an opportunity for the external environment to impinge upon the device environment. One technique of using a via to implement an electrical connection through a package wall is known as a plated via. A plated via is typically a cylindrical void formed in a package wall, with metal deposited, grown, or otherwise deployed on the walls of the void. Plated vias provide a conductive path from the outside of the package to the inside of the package, but leaves a void from the outside to the inside of the package. Even when an effort has been made to seal the vias, the seal may be difficult to maintain over operating and storage temperature extremes due to expansion and contraction of the package and conductors within the vias.

SUMMARY

The described embodiments are directed to device packages that enclose a device within a hermetically sealed cavity. The cavity encompasses the device within a device environment, and isolates the device from an external environment. Electrical connections from the device to components in the external environment are achieved through vias in the device package. The vias are configured to implement a hermetic seal between the device and external environments, and to maintain the seal over operating and storage temperature ranges of the device.

In an embodiment, the hermetic seal may be accomplished with a conformal pinched via (CPV), which is configured to accommodate differences between the coefficient of thermal expansion (CTE) of the package material through which the via passes, and the material of the CPV. Placing the CPV in a wall of the package above the device allows for accessing electrical ports directly, without requiring a signal path to traverse the device substrate prior to reaching the device port.

In one aspect, the invention may be a hermetically sealed component, comprising a glass substrate, and a device associated with the glass substrate. The device may have at least one electrical port. The hermetically sealed component may further comprise a glass cap, at least one side wall, a void extending through the glass cap and a glass pillar from a top surface of the glass cap to a bottom surface of the glass pillar, and an electrically conductive plug disposed within the void. The electrically conductive plug may be configured to be electrically coupled to the at least one electrical port and to hermetically seal the void. The glass cap and the glass substrate may be arranged with the at least one side wall disposed therebetween, to form a cavity encompassing the device. The at least one side wall may be contacting the glass substrate and the glass cap to provide a hermetic seal, such that a first environment within the cavity is isolated from a second environment external to the cavity, and the electrically conductive plug contacting the electrical port.

The device may be one of a microelectromechanical system (MEMS)-based device, and a nanoelectromechanical system (NEMS) device and (iii) an ohmic switch. The hermetic seal may be configured such that a measured helium leak rate is less than 1.0×10−6 (atm-cm)3/second. The glass substrate and the glass cap may comprise one or more of (i) silicon dioxide (SiO2), (ii) fused silica, (iii) silica glass, (iv) quartz, (v) sodium-doped glass, and (vi) borosilicate glass. The device may be associated with the glass substrate by being integrated on the glass substrate using a series deposition-lithography-pattern etch process.

The electrically conductive plug may be electrically coupled to the at least one electrical port by metal thermocompression bonding.

A bond between the side wall and one or both of the glass cap and the glass substrate may be implemented by one of (i) metal compression, (ii) eutectic bonding, (iii) laser bonding, (iv) glass frit, and (v) anodic wafer bonding.

The void may be hourglass-shaped, and the electrically conductive plug and the void may form a conformal pinched via (CPV). The glass cap may further comprise a re-distribution layer disposed on a top surface of the glass cap and electrically coupled to the electrically conductive plug. The re-distribution layer may comprise at least one of gold, aluminum, and copper. The void may have a diameter less than 500 μm in a plane defined by the top surface of the glass cap. A portion of the cavity, defined by the glass cap and the at least one side wall, may be formed such that the glass cap and the at least one side wall comprise a single, integrated component. A portion of the cavity, defined by the glass substrate and the at least one side wall, may be formed such that the glass substrate and the at least one side wall comprise a single, integrated component.

The device may comprise one of (i) a single throw ohmic switch and (ii) a multi-throw ohmic switch. The device may consist of metal, polysilicon, or both.

The electrically conductive plug of the CPV may expand or contract to mitigate a difference between a coefficient of thermal expansion (CTE) of the glass cap and a CTE of the electrically conductive plug. The device may comprise two or more distinct devices.

The hermetically sealed component may further comprise an additional void extending through the glass substrate from a bottom surface of the glass substrate to a top surface of the glass substrate, with an additional electrically conductive plug disposed within the void. The additional electrically conductive plug may be configured to be electrically coupled to an additional one of the at least one electrical port, and to hermetically seal the void.

In another aspect, the invention may be a hermetically sealed component fabricated together with a plurality of hermetically sealed components, comprising a glass substrate, and at least two devices associated with the glass substrate. Each of the at least two devices may have at least one electrical port. The hermetically sealed component fabricated together with a plurality of hermetically sealed components may further comprise a glass cover comprising a glass cap for each of the at least two devices. Each of the glass caps may have (i) at least one side wall, (ii) a void extending through the glass cap and a glass pillar from a top surface of the glass cap to a bottom surface of the glass pillar, and (iii) an electrically conductive plug disposed within the void. The electrically conductive plug may be configured to be electrically coupled to the at least one electrical port of a respective device and to hermetically seal the void. The glass cover may be disposed on the glass substrate such that each of the at least two glass caps covers a corresponding device on the glass substrate to form a cavity encompassing the device. The at least one side wall may be attached to the glass substrate to provide a hermetic seal, such that a first environment within the cavity is isolated from a second environment external to the device package.

In another aspect, the invention may be a method of fabricating a plurality of device packages, comprising fabricating at least two devices directly on a glass substrate, each of the at least two devices having at least one electrical port, and fabricating a glass cover that comprises at least two glass caps, one for each of the two devices. Each of the at least two glass caps may have (i) at least one side wall, (ii) a void extending through the glass cap and a glass pillar from a top surface of the glass cap to a bottom surface of the glass pillar, and (iii) an electrically conductive plug disposed within the void. The electrically conductive plug may be configured to be electrically coupled to the at least one electrical port of a respective device and to hermetically seal the void. The method may further comprise disposing the glass cover on the glass substrate, each of the at least two glass caps covering a corresponding device on the glass substrate, thereby forming a cavity that encompasses the corresponding device. The method may further comprise attaching the at least one side wall to the glass and the glass substrate to provide a hermetic seal, thereby isolating a first environment within the cavity from a second environment external to the device package, and electrically coupling each of the electrically conductive plugs to a respective electrical port.

In another aspect, the invention may be a package hosting a symmetrical switch, comprising a switch having at least one pole corresponding to a first contact and at least two throws associated with at least a second contact and a third contact. The switch may be disposed on a surface of a glass substrate, and the second contact and the third contact may be symmetrically distributed about the first contact. The package hosting a symmetrical switch may further comprise a glass cap having at least one side wall. For each of the first contact and the at least second and third contacts, the package hosting a symmetrical switch may further comprise (i) a void extending through the glass cap and a glass pillar from a top surface of the glass cap to a bottom surface of the glass pillar, and (ii) an electrically conductive plug disposed within the void, the electrically conductive plug configured to be electrically coupled to the at least one electrical port and to hermetically seal the void. The glass cap may be disposed on the glass substrate to form a cavity encompassing the device. The at least one side wall may contact the glass substrate to provide a hermetic seal, such that a first environment within the cavity is isolated from a second environment external to the device package. The switch may be a multi-pole, multi-throw switch comprising two or more poles each corresponding to a respective pole contact.

In another aspect, the invention may be a package hosting a single pole, single throw switch, comprising a switch having a pole corresponding to a first contact and a throw associated with at least a second contact. The switch may be disposed on a surface of a glass substrate. The package hosting a single pole, single throw switch may further comprise a glass cap having at least one side wall. For each of the first contact and the second contact, the package hosting a single pole, single throw switch may further comprise (i) a void extending through the glass cap and a glass pillar from a top surface of the glass cap to a bottom surface of the glass pillar, and (ii) an electrically conductive plug disposed within the void. The electrically conductive plug may be configured to be electrically coupled to the at least one electrical port and to hermetically seal the void. The glass cap may be disposed on the glass substrate to form a cavity encompassing the device. The at least one side wall may contact the glass substrate to provide a hermetic seal, such that a first environment within the cavity is isolated from a second environment external to the device package.

In another aspect, the invention may be a device package, comprising a symmetrically configured device having at least a first contact, a second contact, and a third contact. The symmetrically configured device may be disposed on a surface of a glass substrate. The second contact and the third contact may be symmetrically distributed about the first contact with respect to the surface of the glass substrate. The device package may further comprise a glass cap having at least one side wall. For each of the at least first contact, second contact and third contact, the package may further comprise (i) a void extending through the glass cap and a glass pillar from a top surface of the glass cap to a bottom surface of the glass pillar, and (ii) an electrically conductive plug disposed within the void. The electrically conductive plug may be configured to be electrically coupled to the at least one electrical port and to hermetically seal the void. The glass cap may be disposed on the glass substrate to form a cavity encompassing the symmetrically configured device. The at least one side wall may contact the glass substrate to provide a hermetic seal, such that a first environment within the cavity is isolated from a second environment external to the device package.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 3C shows a plurality of devices arranged in a two-dimensional grid array on a common substrate according to the invention.

DETAILED DESCRIPTION

A description of example embodiments follows.

The teachings of all patents, published applications and references cited herein are incorporated by reference in their entirety.

Figure 1A:
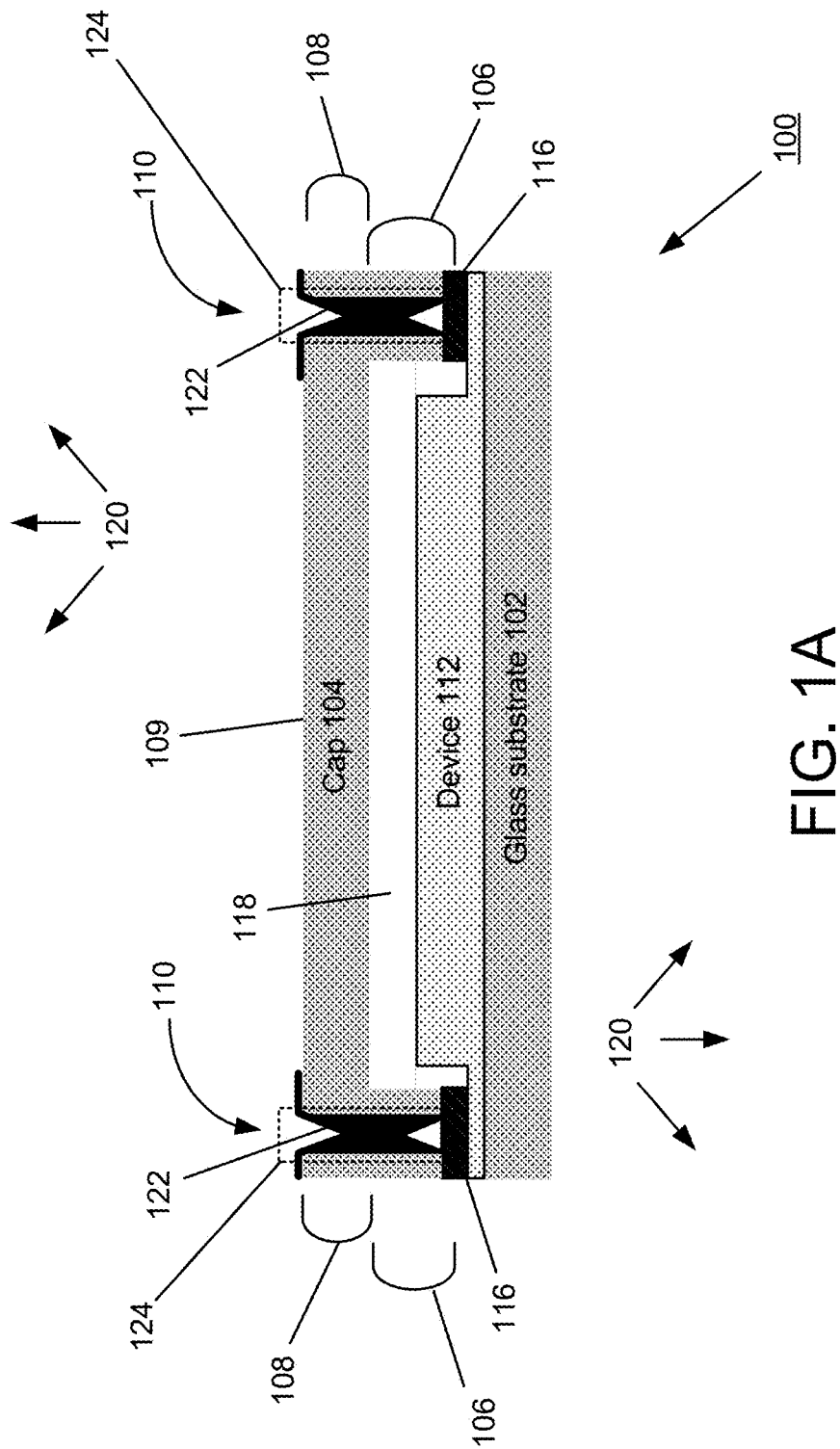
FIG. 1A shows an example embodiment of a hermetically sealed component according to the invention.
Figure 1B:
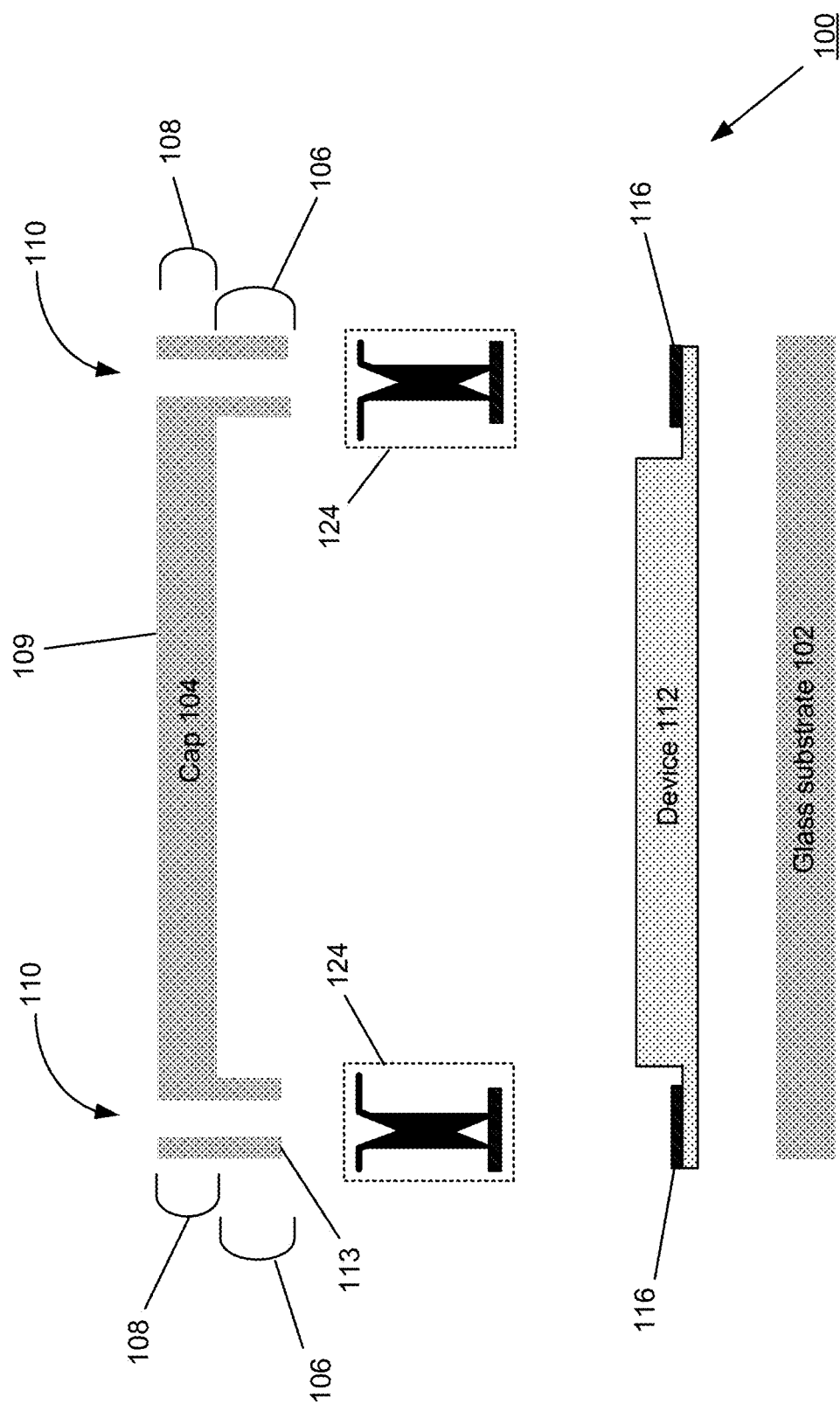
FIG. 1B illustrates an exploded view of the component shown in FIG. 1A.

FIG. 1A illustrates an example embodiment of a hermetically sealed component 100 as described herein. FIG. 1B illustrates an exploded view of the component 100 shown in FIG. 1A. The hermetically sealed component 100 may comprise a glass substrate 102 and a glass cap 104. The glass cap 104 may comprise a cap side wall 106 and a cap upper wall 108. The glass cap 104 and the glass substrate 102 may be fabricated from any of a variety of glass materials, such as silicon dioxide ($SiO_2$), fused silica, silica glass, quartz, sodium-doped glass, and borosilicate glass. In other embodiments, the substrate and cap may consist of non-glass materials, such as Silicon (Si), Silicon Carbide (SiC) and Galium Nitride (GaN), although other non-glass materials may also be used. Although the example embodiment shown in FIGS. 1A and 1B identify a glass cap 104 with a distinct cap side wall 106 and a distinct cap upper wall 108, the glass cap 104 may be fabricated with the side wall and the upper wall consolidated to form a single integrated glass cap 104. Similarly, the side wall and the glass substrate 102 may be consolidated to form a single glass substrate unit with an integrated side wall.

The coefficient of thermal expansion (CTE) of the glass cap material should be substantially the same as the CTE of the glass substrate material, to minimize stress at any bonding joints between the glass cap 104 and the glass substrate 102.

A void 110 may be implemented in the glass cap 104, for example through the entire thickness of the glass cap 104 cap, as shown in FIGS. 1A and 1B, thereby creating a passageway through the glass cap 104. In the example embodiment of FIGS. 1A and 1B, the void 110 is shown formed in the glass cap 104 and side wall 106 from the top surface 109 of the glass cap to the bottom surface 113 of the side wall 106. In other embodiments, the void may be formed in other locations, for example laterally through the side wall 106 or up through the glass substrate 102. The void may be configured to be cylindrical with a circular cross-section, although in other embodiments the void may have a non-cylindrical cross-section, for example an elliptical cross section or an irregular cross section. Alternatively, the void may be characterized by a non-constant cross-sectional diameter from the top surface 109 of the glass cap to the bottom of the glass cap. The void may be characterized by a diameter of less than or equal to 500 µm in a plane defined by the upper wall top surface.

Figure 1C:
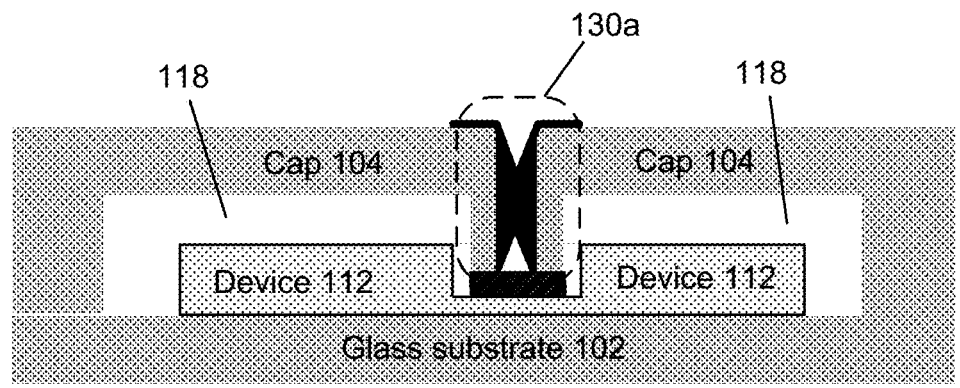
FIG. 1C shows another example embodiment of a hermetically sealed component according to the invention.
Figure 2A:
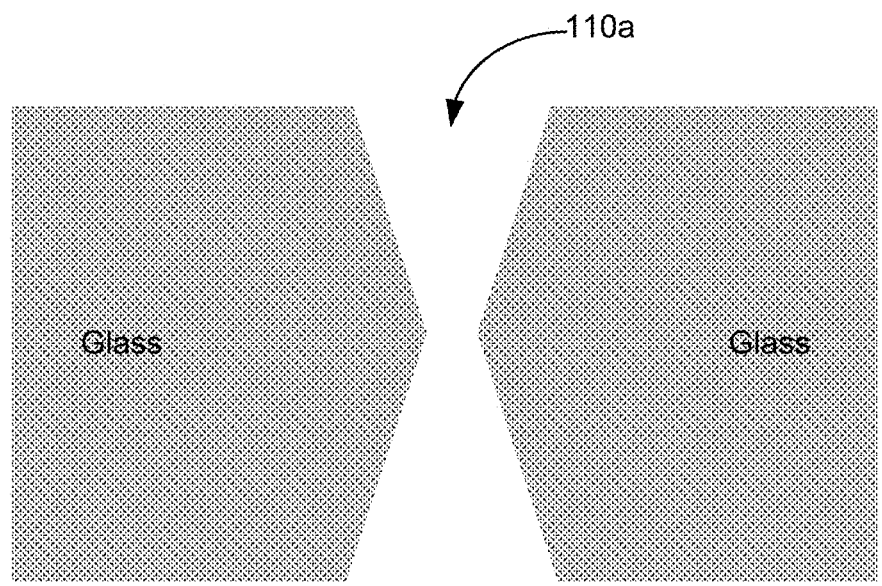
FIG. 2A shows a cross-sectional view of an hourglass-shaped void according to the invention.
Figure 2B:
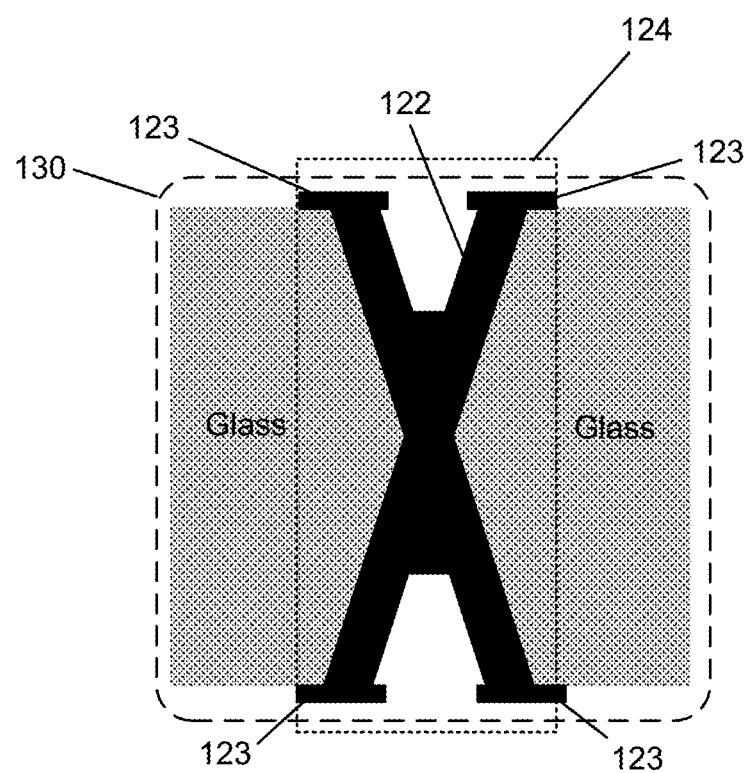
FIG. 2B shows a cross-sectional view of an embodiment of the metallic plug of a conformal pinched via, according to the invention

In some embodiments, a cross-sectional view of the void 110 may exhibit an "hourglass" shape, as shown in FIGS. 2A and 2B. A shaped metallic plug 122 may be disposed within the hourglass void 110a, thereby implementing a conformal pinched via (CPV) 124 in the glass cap or substrate. The metallic plug 122 may be formed in the hourglass void 110a by filling the hourglass void 110a by conformal plating from the side wall of the hourglass void 110a, until the plated thickness closes off the center region. The resulting shape of the metallic plug 122 is such that the hourglass void 110a is not completely filled across the top of the glass cap (or substrate) to the bottom of the glass cap (or substrate). Glass may extend from the glass cap or glass substrate to form a glass pillar, as shown for example in FIG. 1C. In this case, the void extends through the outer (top) surface 330 of the glass cap (or substrate) and bottom surface 332 of the glass pillar, as depicted in the example embodiment shown in FIG. 3B. The CPV 124, along with the glass cap material surrounding it, is referred to herein as a CPV pillar 130.

Figure 2C:
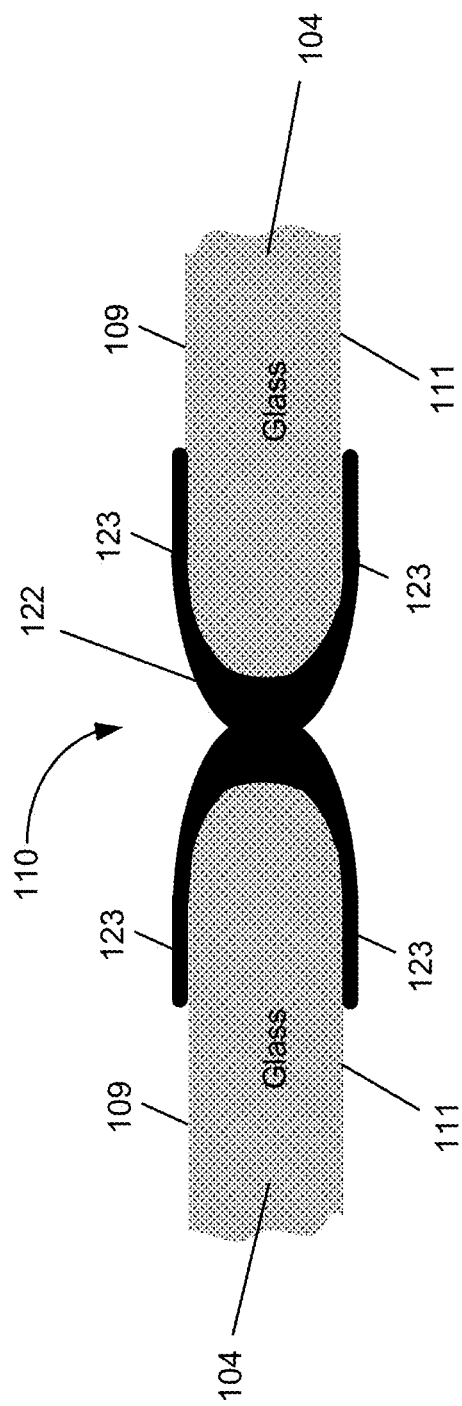
FIG. 2C illustrates a cross-sectional view of another embodiment of the metallic plug of a conformal pinched via, according to the invention.

Portions 123 of the metallic plug 122 may extend along the top surface 109 and/or the bottom surface 111 of the glass cap 104. The portions 123 may be a redistribution layer (RDL). The redistribution layer may be selected from a variety of metals, for example gold, aluminum, and copper. This incomplete filling of the void by the metallic plug may contribute to accommodating relative differences in expansion and contraction of the glass cap 104 and the metallic plug 122 across operating and storage temperature ranges of the hermetically sealed component 100, thereby maintaining a hermetic seal at the CPV. In other words, the described configuration of the metallic plug may mitigate a difference between a coefficient of thermal expansion (CTE) of the glass cap and a CTE of the electrically conductive plug, thereby maintaining a hermetic seal at the CPV across operating and storage temperature ranges of the hermetically sealed component 100. FIG. 2C shows an alternative embodiment of the hourglass-shaped CPV 124.

The device 112 may be fabricated directly on the glass substrate 102. In an embodiment, the device is fabricated on the glass substrate 102 using a series deposition-lithography-pattern etch process. The device 112 may comprise at least one electrical port 116, through which electrical signals may enter and/or leave the device 112.

Although not shown, the glass substrate 102 and the glass cap 104 may be laterally extended beyond the device 112. At the laterally-outer portions of the device 112, the glass cap side walls may extend down to contact the glass substrate 102. In these extended regions, the glass cap 104 may be fixedly attached to the glass substrate 102 by, for example, metal thermo-compression bonding (also referred to herein as metal bonding), eutectic bonding, laser bonding, glass frit bonding, and anodic wafer bonding, although other bonding techniques known in the art may also be used.

Arranging the glass cap 104 and the glass substrate 102 with the side walls 106 therebetween, as shown in FIG. 1A, forms a cavity 118 that defines a device environment, isolated from an external environment 120. The CPV 124 may be electrically coupled to the device port 116 through, for example, metal thermo-compression bonding.

In some embodiments, the hermetically sealed component 100 may be configured with the side wall 106 being part of the glass substrate 102, rather than part of the glass cap 104, such that the glass cap 104 comprises only the cap upper wall 108. In such a configuration, the cavity 118 is formed by fixedly attaching the glass cap 104 (comprising only the cap upper wall 108) to the side walls of the glass substrate 102.

Figure 1D:
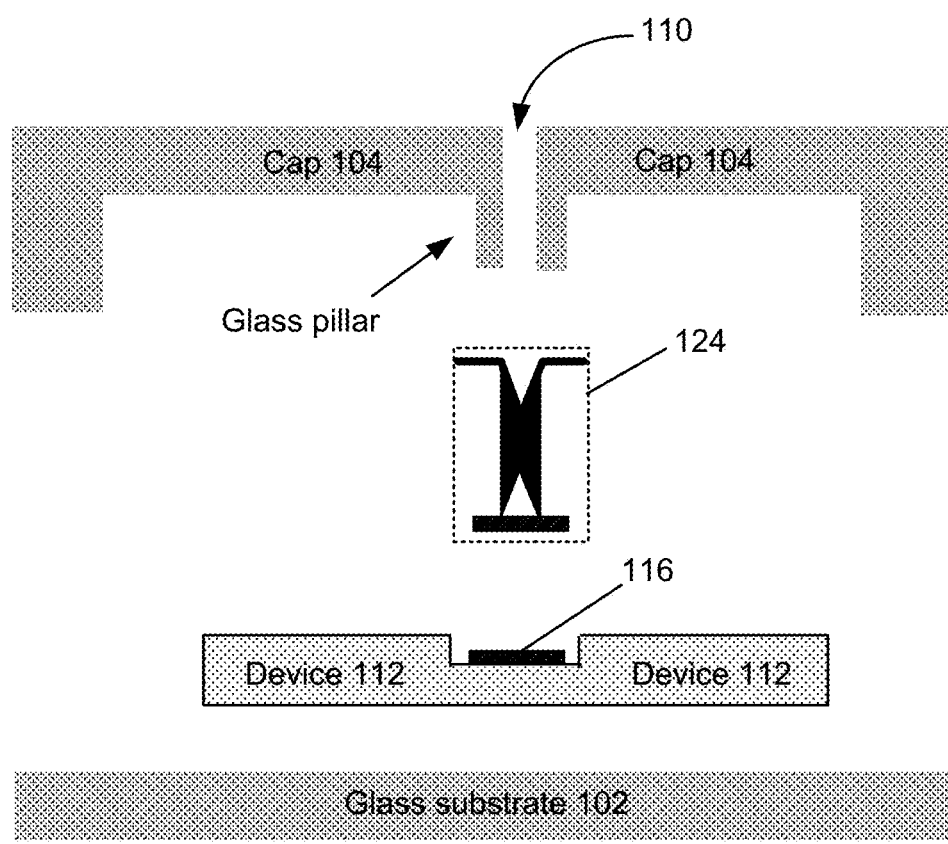
FIG. 1D shows an exploded view of the example embodiment shown in FIG. 1C.
Figure 1E:
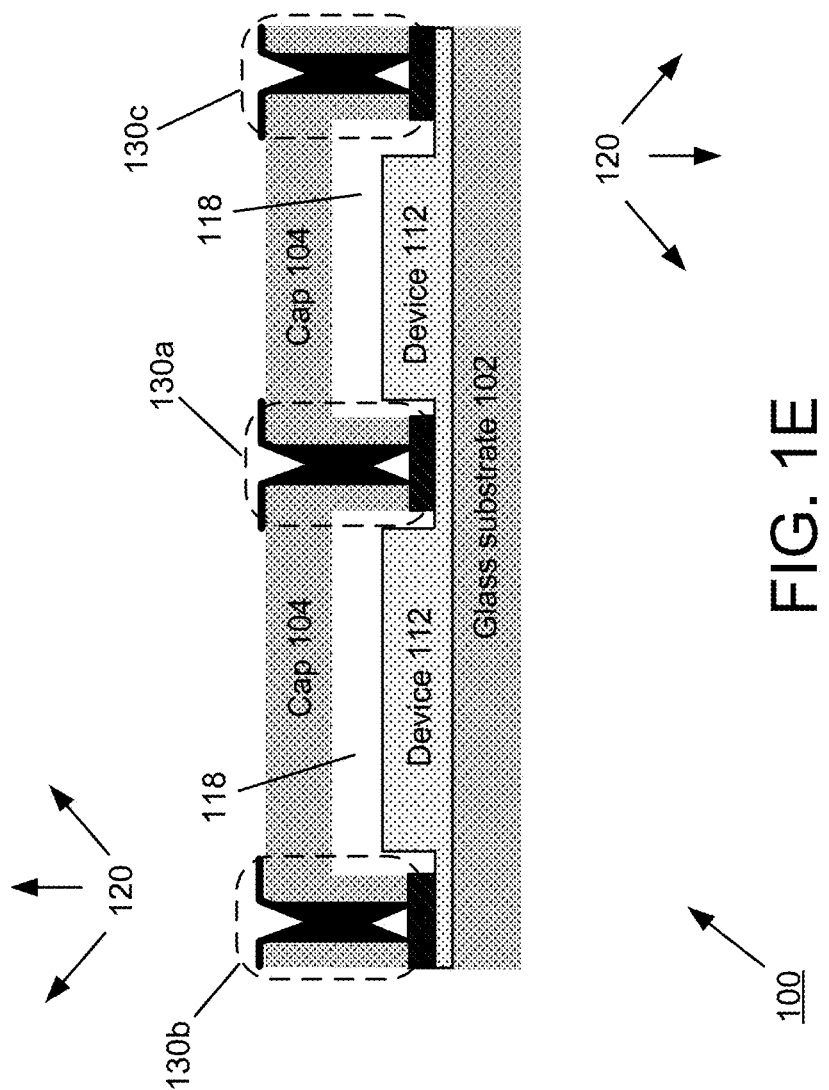
FIG. 1E shows another example embodiment of a hermetically sealed component according to the invention.

Although FIGS. 1A and 1B depict a hermetically sealed component 100 with CPV pillars on the periphery of the device 112, a CPV pillar may contact the device 112 in a middle portion of the device, instead of, or in addition to, the peripheral CPV pillars. FIG. 1C shows an example embodiment with a mid-region pillar 130a, and FIG. 1D shows an exploded view of the example embodiment of FIG. 1C. FIG. 1E illustrates an example embodiment with a mid-region pillar 130a and periphery pillars 130b, 130c.

Figure 1F:
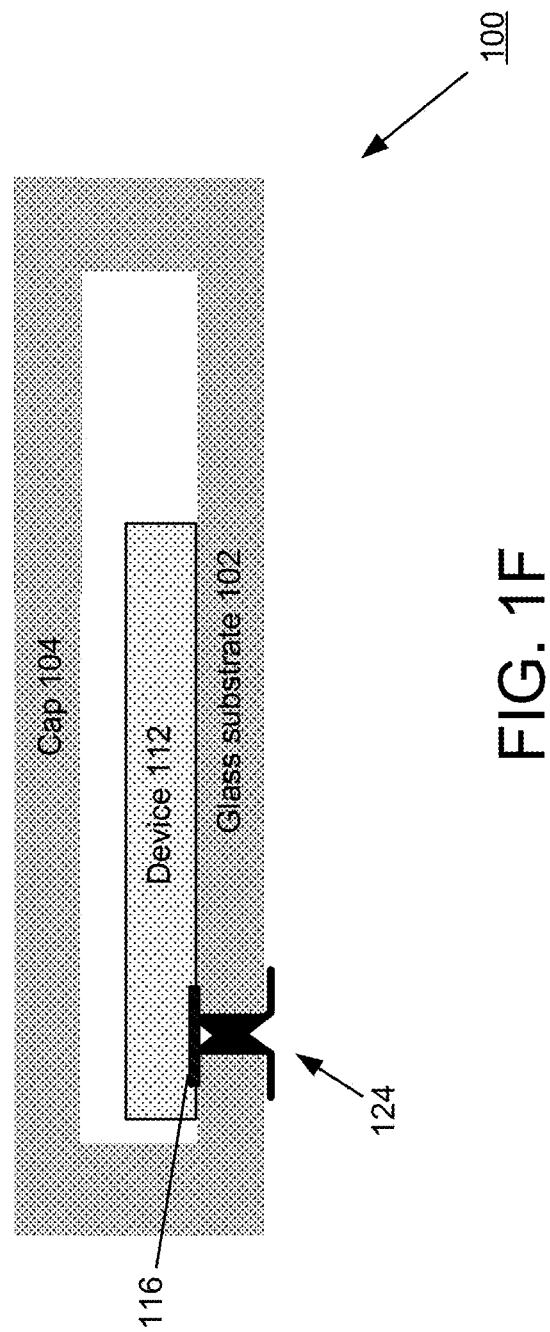
FIG. 1F shows yet another example embodiment of a hermetically sealed component according to the invention.

Further, as shown in FIG. 1F, a CPV 124 may be implemented through the glass substrate 102, as described for the glass cap. A CPV pillar through the glass substrate 102 may facilitate electrical signals to be coupled to a device port 116 on the underside of the device 112, and electrical communication through the glass substrate side of the hermetically sealed component 100. An embodiment with CPV pillars both in the glass cap and in the glass substrate may be used, for example, to interface to a component, such as a controller, mounted on the glass cap, while other external components may interface to the device 112 through the glass substrate.

In some embodiments, the device 112 may be a microelectromechanical system (MEMS)-based device. In other embodiments, the device 112 may be a nanoelectromechanical system (NEMS) device. In other embodiments, the device 112 may be an ohmic switch. The ohmic switch may be a single throw ohmic switch, or a multi-throw ohmic switch. The device may be fabricated of metal, polysilicon, or both.

The embodiments described herein may be configured to provide a hermetic seal, between the device environment within the cavity 118 and the external environment 120, capable of providing a measured helium leak rate that is less than $1.0 \times 10^{-6}$ (atm-cm)$^3$/second.

In some embodiments, the device 112 may comprise two or more electrical ports 116, with corresponding CPVs 124 configured to convey electrical signals to and from the device 112 outside of the device environment defined by the cavity 118. In other embodiments, the device 112 may comprise two or more devices fabricated on the glass substrate 102, each having device port(s) and corresponding CPV(s).

Figure 3A:
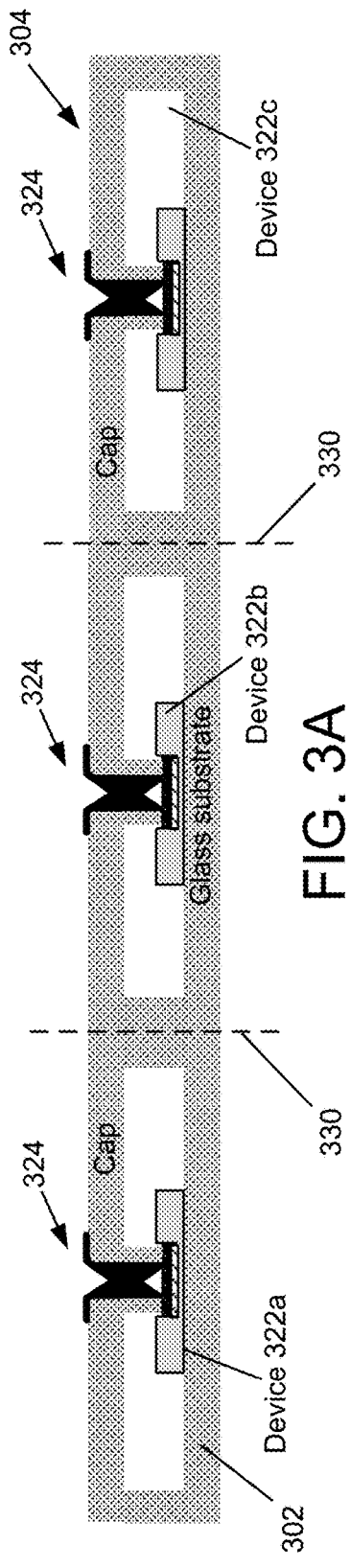
FIG. 3A illustrates an example of a wafer-scale hermetically sealed package assembly according to the invention.
Figure 3B:
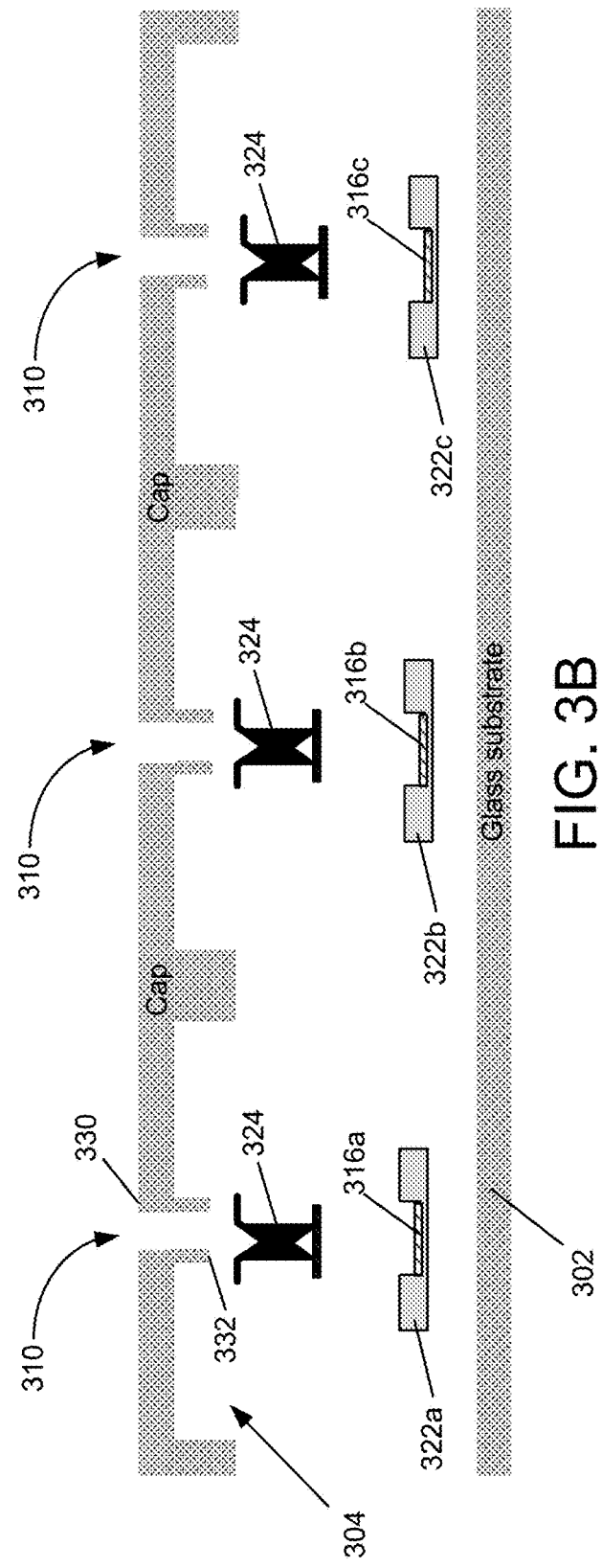
FIG. 3B shows an exploded view of the wafer-scale hermetically sealed package assembly of FIG. 3A.
Figure 3C:
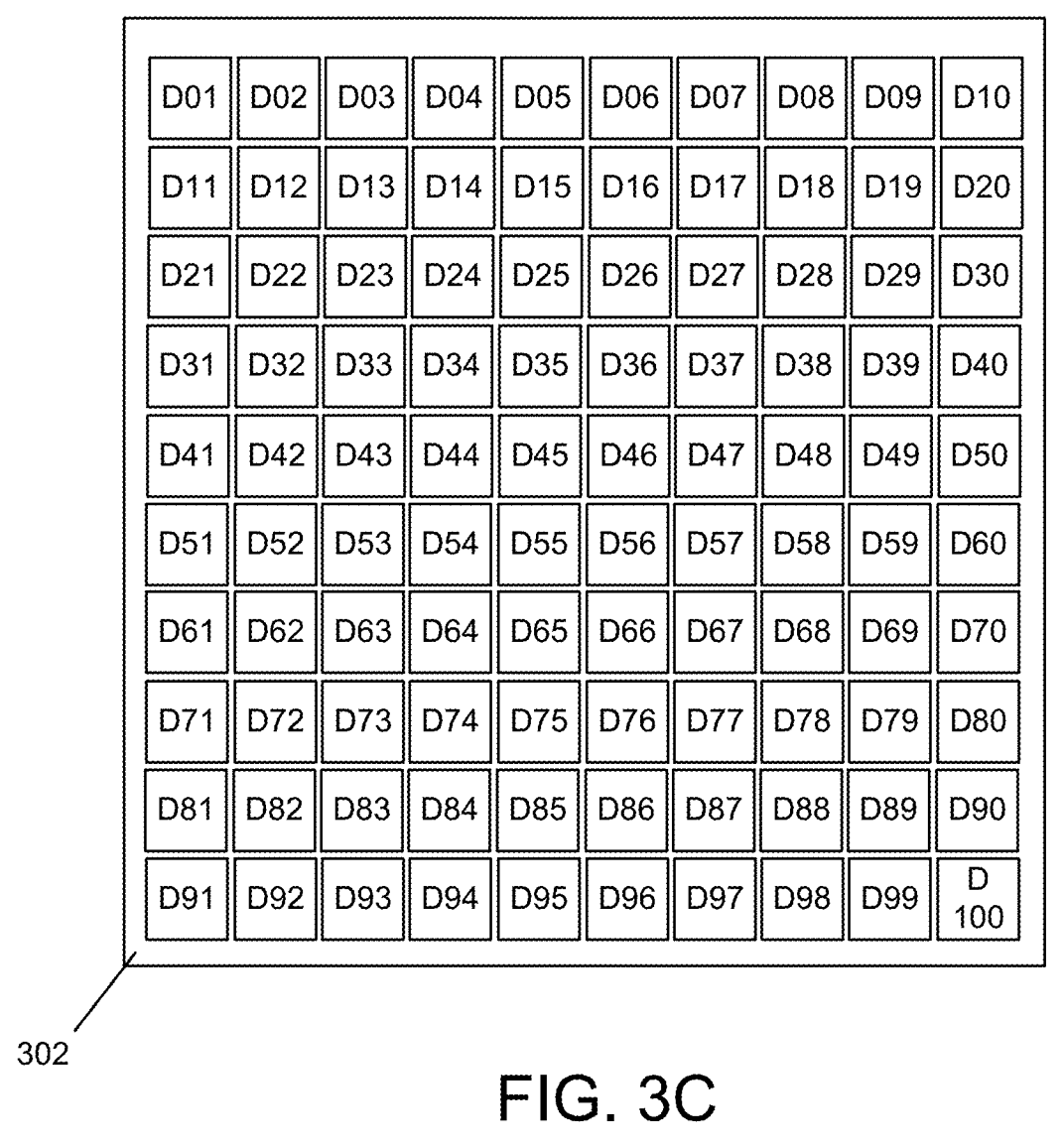

The described embodiments may be directed to two or more hermetically sealed components fabricated together in what is referred to as wafer-scale fabrication. Referring to FIG. 3A, two or more devices may be fabricated on a common glass substrate 302. FIG. 3B depicts an exploded view of the assembly shown in FIG. 3A. In the example embodiment depicted in FIGS. 3A and 3B, three devices, device 322a, 322b, 322c, are shown fabricated on glass substrate 302. Although only three devices are shown in this example embodiment for descriptive simplicity, more devices may be implemented in other embodiments. For example, FIG. 3C shows another example embodiment with 100 devices, from device D01 through device D100, each of which is attached to the common glass substrate 302 in a 10×10 grid pattern. FIG. 3C is a top-down view of the devices on the common glass substrate 302, contrasted with the sectional side-views of FIGS. 1A, 1B, 1C, 2, 3A and 3B.

In an embodiment, a single, composite glass cap structure 304 may comprise individual glass caps for each of the devices D01 through D100 attached to the glass substrate 302. Each individual glass cap may include at least one CPV 324 for conveying electrical signals to/from its respective device. As described herein, the CPV 324 is formed by a metallic plug disposed within an hourglass-shaped void 310 in the glass cap structure 304. Although the CPVs 324 shown in FIGS. 3A and 3B are CPV pillars arranged in the center of the device cavity, the CPV pillars may be disposed within the side walls instead of or in addition to the center positioned CPV pillars.

As described herein with respect to FIGS. 1A, 1B, 1C, 2, each individual glass cap of the composite cap structure 304 may have side walls associated with an upper cap wall to implement a device cavity, or the side walls may be associated with the common glass substrate 302 to facilitate the device cavity.

The composite glass cap structure 304 may be fixedly attached to the common glass substrate 302, which hosts the devices 322a, 322b, 322c with device ports 316a, 316b, 316c, as shown in FIG. 3A, thereby forming an assembly of two or more individual device packages. Three individual device packages are formed in the example of FIG. 3A. Each individual device 322n (where 'n' is an index from 1 to N, where N denotes the total number of devices being packaged), and its respective individual glass cap and individual glass substrate, may be separated from its neighbors in the combined assembly (i.e., composite glass cap, glass substrate and device) by cutting at the delineations 330 shown in FIG. 3A. Such cutting may be performed by any of various methods of accomplishing integrated circuit wafer die as is known in the art. In a grid array of packages, as depicted in FIG. 3C, orthogonal cuts (e.g., in the 'x' direction and 'y' direction, where the x-y plane is parallel to the surface of the common glass substrate 302) are made across the assembly, to separate individual Dn package elements.

Although the example embodiments described herein depict a single device packaged within a hermetically sealed device environment, the techniques described herein may alternatively be used to hermetically seal two or more devices within a common device environment.

A device packaged as described herein may include a MEMS-based or a NEMS-based device, although other types of devices may also be packaged according to the described embodiments. Specific types of MEMS or NEMS based devices may include a single-pole-single-throw switch, a single-pole-multi-throw switch, a multi-pole-single throw switch, or a multi-pole-multi-pole switch. An advantage to the described embodiments is that electrical signal paths to switch poles and switch throw ports do not need to follow a purely two-dimensional path, e.g., along the surface of the glass substrate.

Figure 4A:
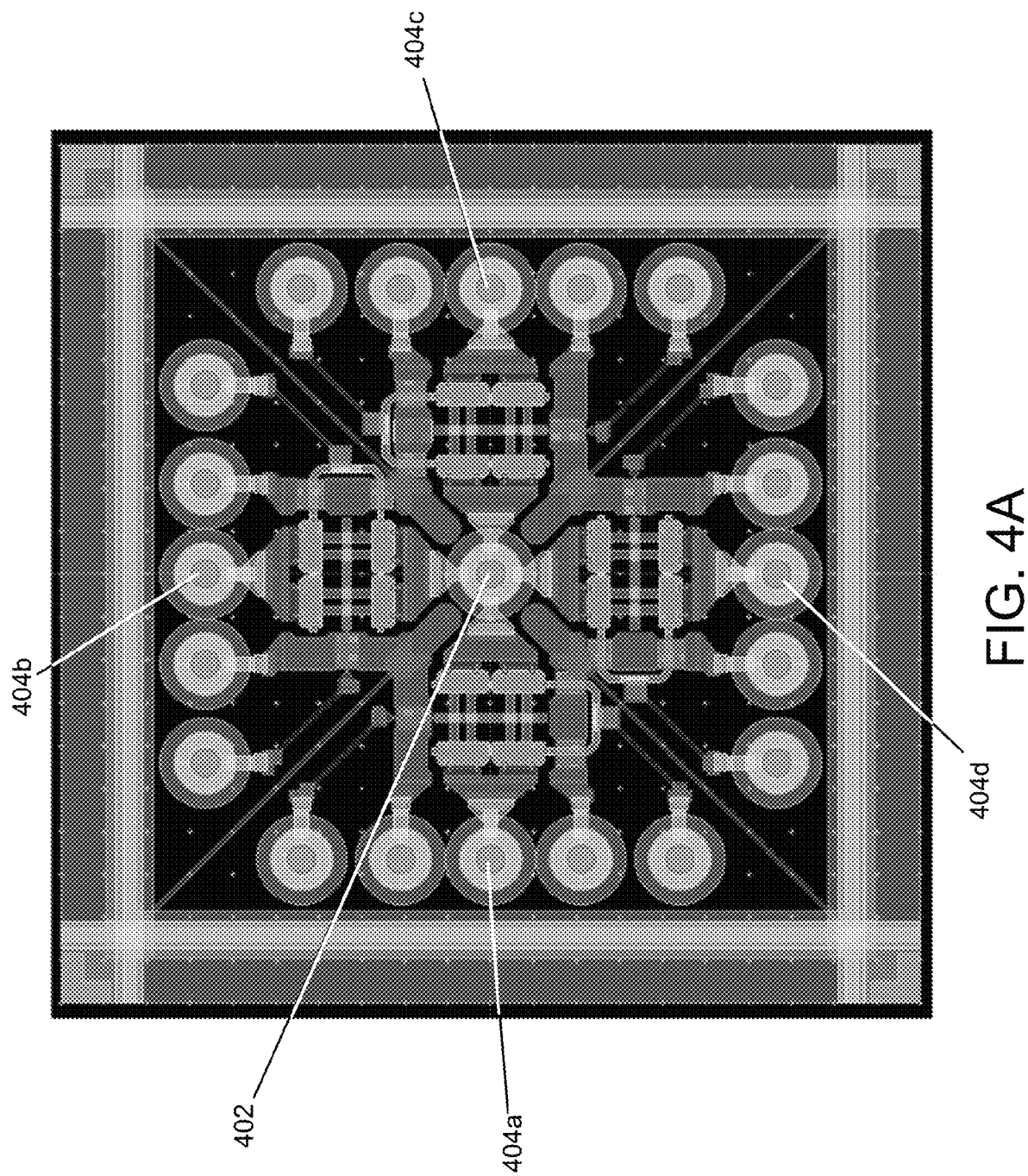
FIG. 4A illustrates a top view of an example single pole, four-throw MEMS switch according to the invention.
Figure 4B:
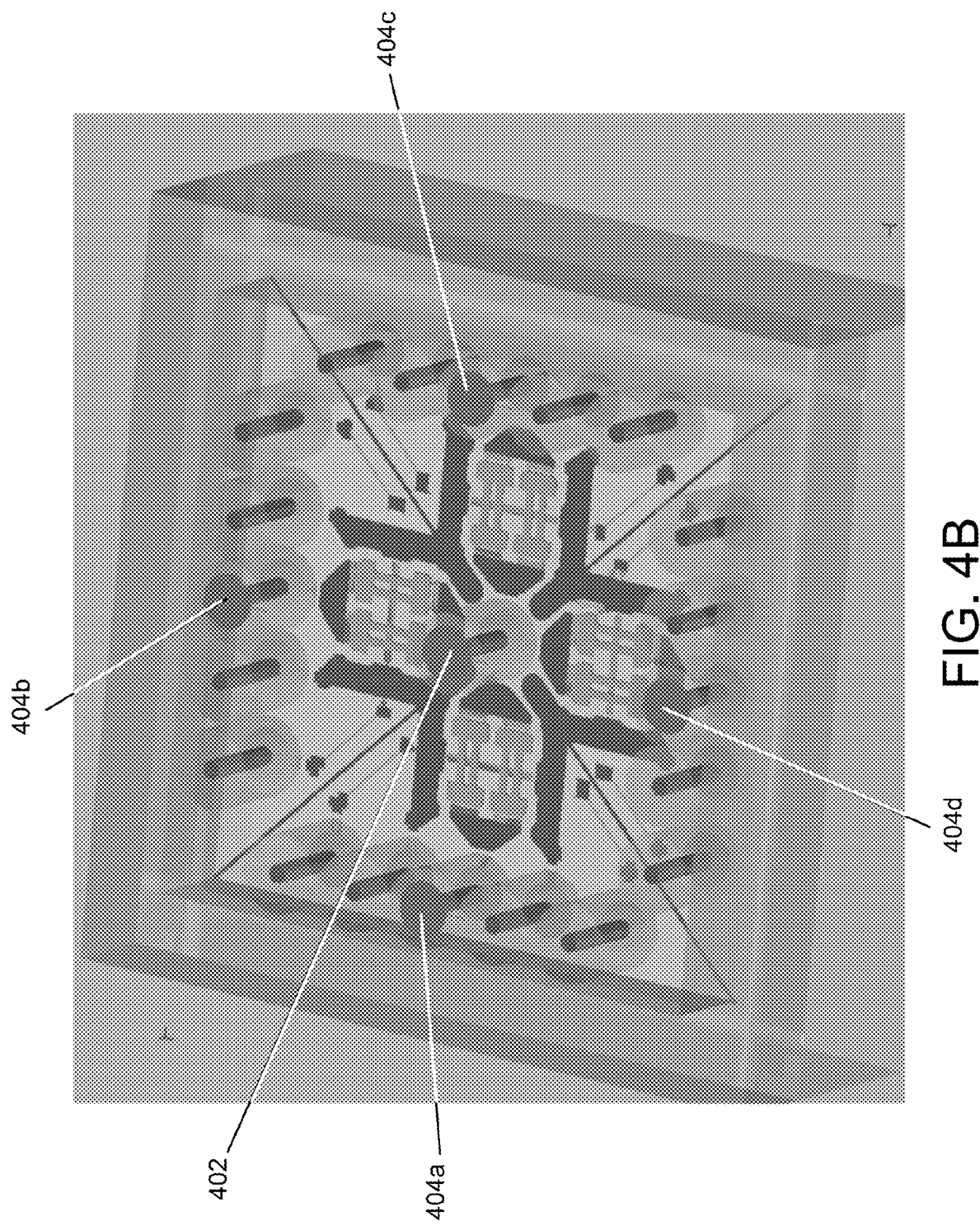
FIG. 4B illustrates an isometric view of the MEMS switch depicted in FIG. 4A.

An example symmetrical single-pole, four-throw (SP4T) MEMS switch is shown in a top view in FIG. 4A, and in an isometric view in FIG. 4B. The pole of the switch is situated centrally, with the four throws distributed symmetrically about the pole (to the top of the pole, to the bottom of the pole, to the left of the pole, and to the right of the pole). A pole CPV 402 is situated in the package glass cap directly above the pole port of the SP4T switch. Throw poles 404a, 404b, 404c, 404d are situated at each of the respective throw ports. Compared to signal distribution architectures that are restricted to two-dimensional routing, the required physical substrate space of this example embodiment is substantially reduced, because the center signal connection at CPV 402 is used for single pole port. Accordingly, no space needs to be reserved on the MEMS wafer for the single pole port signal trace routing. This direct access to the switch pole port may result in improved switch performance because of a shorter distance from the pole port to throw ports. All electrical paths are identical from the pole port to each throw port, which facilitates identical behavior for each throw channel.

The examples described herein depict device ports connected to CPV pillar electrical ports situated in the package top cap, which facilitates direct "three-dimensional" access to the device ports. It should be understood, however, that the CPV pillar ports can be situated in other package locations, for example on the side walls. Further, one or more package electrical ports may be non-CPV ports, providing traditional two-dimensional access to device ports at the periphery of the device, in addition to the CPV pillar ports.

Figure 5:
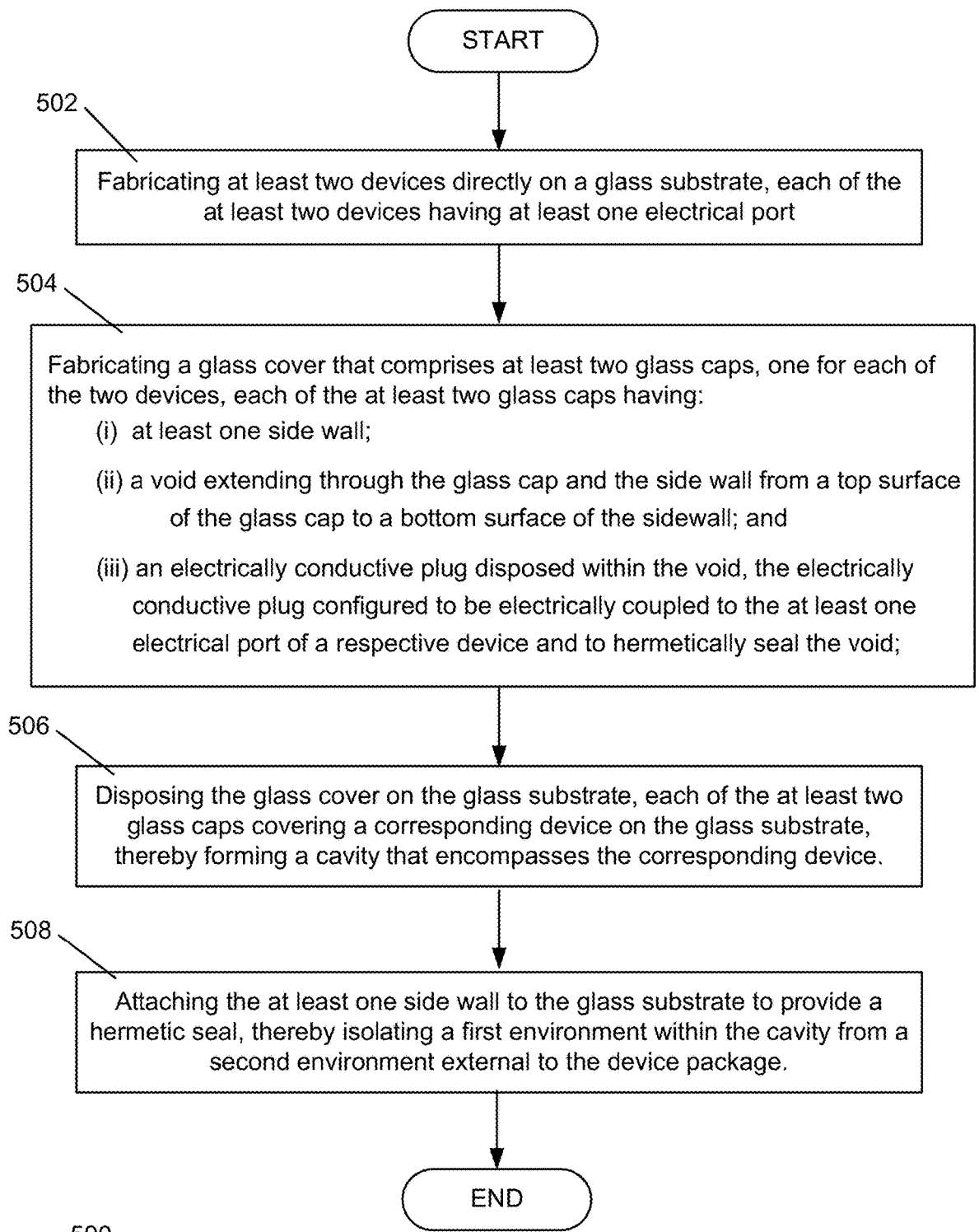
FIG. 5 illustrates an example embodiment of a method of fabricating a plurality of device packages.

FIG. 5 illustrates an example embodiment of a method 500 of fabricating a plurality of device packages, which may comprise attaching 502 at least two devices to a glass substrate. Each of the at least two devices may comprise at least one electrical port. The method 500 may further comprise fabricating 504 a glass cover that comprises at least two glass caps, one for each of the two devices. Each of the at least two glass caps may have an upper wall and at least one side wall. The upper wall may have a void extending through the upper wall from an upper wall top surface to an upper wall bottom surface. Each of the glass caps may further have an electrically conductive plug disposed within the void, the electrically conductive plug hermetically sealing the void. Each of the glass caps may further have a conductor configured to electrically couple the electrically conductive plug to the electrical port. The method may further comprise disposing 506 the glass cover on the glass substrate. Each of the glass caps may cover a corresponding device on the glass substrate, thereby forming a cavity that encompasses the corresponding device. The method may further comprise attaching 508 the at least one side wall to the glass substrate to provide a hermetic seal, thereby isolating a first environment within the cavity from a second environment external to the device package.

While example embodiments have been particularly shown and described, it will be understood by those skilled in the art that various changes in form and details may be made therein without departing from the scope of the embodiments encompassed by the appended claims.

What is claimed is:

1. A hermetically sealed component, comprising:
   a glass substrate;
   a device associated with the glass substrate, the device having at least one electrical port;
   a glass cap having at least one side wall, each of the glass substrate and the glass cap having a coefficient of thermal expansion less than or equal to 2.5, and comprising one or more of (i) silicon dioxide (SiO$_2$), (ii) fused silica, (iii) silica glass, and (iv) quartz;
   an hourglass-shaped void extending through the glass cap and a glass pillar from a top surface of the glass cap to a bottom surface of the glass pillar; and
   an electrically conductive plug disposed within the void, the electrically conductive plug configured to be electrically coupled to the at least one electrical port and to hermetically seal the void, the electrically conductive plug and the void configured to form a conformal pinched via (CPV);
   the glass cap and the glass substrate arranged with the at least one side wall disposed therebetween, to form a cavity encompassing the device, the at least one side wall contacting the glass substrate and the glass cap to provide a hermetic seal, such that a first environment within the cavity is isolated from a second environment external to the cavity, and the electrically conductive plug contacting the electrical port.

2. The hermetically sealed component of claim 1, wherein the device is one of (i) a microelectromechanical system (MEMS)-based device, and (ii) a nanoelectromechanical system (NEMS) device and (iii) an ohmic switch.

3. The hermetically sealed component of claim 1, wherein the hermetic seal is configured such that a measured helium leak rate is less than $1.0 \times 10^{-6}$ (atm-cm)$^3$/second.

4. The hermetically sealed component of claim 1, wherein the device is associated with the glass substrate by being integrated on the glass substrate using a series deposition-lithography-pattern etch process.

5. The hermetically sealed component of claim 1, wherein the electrically conductive plug is electrically coupled to the at least one electrical port by metal thermo-compression bonding.

6. The hermetically sealed component of claim 1, wherein a bond between the side wall and one or both of the glass cap and the glass substrate is implemented by one of (i) metal compression, (ii) eutectic bonding, (iii) laser bonding, (iv) glass frit, and (v) anodic wafer bonding.

7. The hermetically sealed component of claim 1, wherein the glass cap further comprises a re-distribution layer disposed on a top surface of the glass cap and electrically coupled to the electrically conductive plug.

8. The hermetically sealed component of claim 7, wherein the re-distribution layer comprises at least one of gold, aluminum, and copper.

9. The hermetically sealed component of claim 1, wherein the void has a diameter less than 500 μm in a plane defined by the top surface of the glass cap.

10. The hermetically sealed component of claim 1, wherein a portion of the cavity, defined by the glass cap and the at least one side wall, is formed such that the glass cap and the at least one side wall comprise a single, integrated component.

11. The hermetically sealed component of claim 1, wherein a portion of the cavity, defined by the glass substrate and the at least one side wall, is formed such that the glass substrate and the at least one side wall comprise a single, integrated component.

12. The hermetically sealed component of claim 1, wherein the device comprises one of (i) a single throw ohmic switch and (ii) a multi-throw ohmic switch.

13. The hermetically sealed component of claim 12, wherein the device consists of metal, polysilicon, or both, coefficient of thermal expansion (CTE) of the glass cap and a CTE of the electrically conductive plug.

14. The hermetically sealed component of claim 1, wherein the device comprises two or more distinct devices.

15. The hermetically sealed component of claim 1, further comprising:
   an additional void extending through the glass substrate from a bottom surface of the glass substrate to a top surface of the glass substrate; and
   an additional electrically conductive plug disposed within the void, the additional electrically conductive plug configured to be electrically coupled to an additional one of the at least one electrical port, and to hermetically seal the void.

16. A package hosting a symmetrical switch, comprising:
   a switch having at least one pole corresponding to a first contact and at least two throws associated with at least a second contact and a third contact, the switch disposed on a surface of a glass substrate, the second contact and the third contact symmetrically distributed about the first contact, such that the switch exhibits symmetry about at least two axes of symmetry, including rotational symmetry, associated with the first contact; and a glass cap having at least one side wall;

for each of the first contact and the at least second and third contacts:
  (i) a void extending through the glass cap and a glass pillar from a top surface of the glass cap to a bottom surface of the glass pillar; and
  (ii) an electrically conductive plug disposed within the void, the electrically conductive plug configured to be electrically coupled to the at least one electrical port and to hermetically seal the void;

the glass cap disposed on the glass substrate to form a cavity encompassing the device, the at least one side wall contacting the glass substrate to provide a hermetic seal, such that a first environment within the cavity is isolated from a second environment external to the device package.

17. The package of claim 16, wherein the switch is a multi-pole, multi-throw switch comprising two or more poles each corresponding to a respective pole contact.

18. A package hosting a single pole, single throw switch, comprising:

a switch having a pole corresponding to a first contact and a throw associated with at least a second contact, the switch disposed on a surface of a glass substrate; and a glass cap having at least one side wall, each of the glass substrate and the glass cap having a coefficient of thermal expansion less than or equal to 2.5, and comprising one or more of (i) silicon dioxide ($SiO_2$), (ii) fused silica, (iii) silica glass, and (iv) quartz;

for each of the first contact and the second contact:
  (i) an hourglass-shaped void extending through the glass cap and a glass pillar from a top surface of the glass cap to a bottom surface of the glass pillar; and
  (ii) an electrically conductive plug disposed within the void, the electrically conductive plug configured to be electrically coupled to the at least one electrical port and to hermetically seal the void, the electrically conductive plug and the void configured to form a conformal pinched via (CPV);

the glass cap disposed on the glass substrate to form a cavity encompassing the device, the at least one side wall contacting the glass substrate to provide a hermetic seal, such that a first environment within the cavity is isolated from a second environment external to the device package.

19. A device package, comprising:

a symmetrically configured device having at least a first contact, a second contact, and a third contact, the symmetrically configured device disposed on a surface of a glass substrate, the second contact and the third contact symmetrically distributed about the first contact with respect to the surface of the glass substrate, such that the switch exhibits symmetry about at least two axes of symmetry, including rotational symmetry, associated with the first contact; and a glass cap having at least one side wall;

for each of the at least first contact, second contact and third contact:
  (i) a void extending through the glass cap and a glass pillar from a top surface of the glass cap to a bottom surface of the glass pillar; and
  (ii) an electrically conductive plug disposed within the void, the electrically conductive plug configured to be electrically coupled to the at least one electrical port and to hermetically seal the void;

the glass cap disposed on the glass substrate to form a cavity encompassing the symmetrically configured device, the at least one side wall contacting the glass substrate to provide a hermetic seal, such that a first environment within the cavity is isolated from a second environment external to the device package.

* * * * *

UNITED STATES PATENT AND TRADEMARK OFFICE
CERTIFICATE OF CORRECTION

PATENT NO. : 11,148,935 B2
APPLICATION NO. : 16/283306
DATED : October 19, 2021
INVENTOR(S) : Xu Zhu et al.

Page 1 of 1

It is certified that error appears in the above-identified patent and that said Letters Patent is hereby corrected as shown below:

On the Title Page

Item (72) Inventors, replace "Darryl R. Evans" with --Darryl E. Evans--.

In the Claims

In Claim 13, Column 10, from Line 47 to Line 49, delete "both, coefficient of thermal expansion (CTE) of the glass cap and a CTE of the electrically conductive plug." and insert --both.--.

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*